US006083883A

United States Patent [19]

Lithgow

[11] Patent Number: 6,083,883

[45] Date of Patent: *Jul. 4, 2000

[54] METHOD OF FORMING A DIELECTRIC AND SUPERCONDUCTOR RESONANT STRUCTURE

[75] Inventor: Robert D. Lithgow, Schaumburg, Ill.

[73] Assignee: Illinois Superconductor Corporation, Mt. Prospect, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/638,435

[22] Filed: Apr. 26, 1996

(Under 37 CFR 1.47)

[51] Int. Cl.[7] .............................. H01L 39/24; H01P 7/04

[52] U.S. Cl. ....................... 505/210; 505/238; 333/219.1; 333/222; 333/99 S

[58] Field of Search .................................... 333/219, 222, 333/99 S; 505/210, 230, 238, 239, 701, 704, 866; 428/373, 376, 378, 392, 688, 689, 699, 701, 702, 930

[56] References Cited

U.S. PATENT DOCUMENTS

| | | | |
|---|---|---|---|
| 4,318,064 | 3/1982 | Käch | 333/202 |
| 4,344,052 | 8/1982 | Davidson | 333/222 |
| 4,431,977 | 2/1984 | Sokola et al. | 333/206 |
| 4,441,088 | 4/1984 | Anderson | 333/1 |
| 4,463,328 | 7/1984 | Doty | 333/222 |
| 4,559,504 | 12/1985 | Krec | 337/194 |
| 4,879,533 | 11/1989 | de Muro et al. | 333/206 |
| 4,918,050 | 4/1990 | Dworsky | 505/1 |
| 4,996,188 | 2/1991 | Kommrusch | 505/1 |
| 5,055,808 | 10/1991 | Walker et al. | 333/207 |
| 5,172,085 | 12/1992 | Glenat et al. | 333/222 |
| 5,179,074 | 1/1993 | Fiedziuszko et al. | 505/1 |
| 5,210,511 | 5/1993 | Izumi et al. | 333/222 |
| 5,324,713 | 6/1994 | Shen | 505/210 |
| 5,340,797 | 8/1994 | Hodge et al. | 505/4.7 |
| 5,457,087 | 10/1995 | Dorothy et al. | 505/210 |
| 5,585,331 | 12/1996 | Mansour et al. | 505/210 |

OTHER PUBLICATIONS

Alford et al., Surface Resistance of Bulk and Thick Film $YBa_2CU_3O_x$, *IEEE Transactions on Magnetics*, vol. 27, No. 2, pp. 1510–1518, Mar. 1991.

Lancaster et al., "Superconducting microwave resonators," *IEEE Proceedings–H*, vol. 139, No. 2, pp. 149–156, Apr. 1992.

*Primary Examiner*—Roy V. King
*Attorney, Agent, or Firm*—Marshall, O'Toole, Gerstein, Murray & Borun

[57] ABSTRACT

A resonant structure has a center conductor, a dielectric element, and an outer conductor. The center conductor is a substrate with a coating of a superconductor on its outer surface, and the outer conductor is a substrate with a coating of a superconductor on its inner surface. The dielectric element has a passageway which is sized for receiving the inner conductor so that there is substantially complete contact between the layers of superconductor coating and the dielectric. Similarly, the outer surface of the dielectric element is sized to match the inner superconductor coated surface of the outer conductor.

8 Claims, 2 Drawing Sheets

FIG. 1
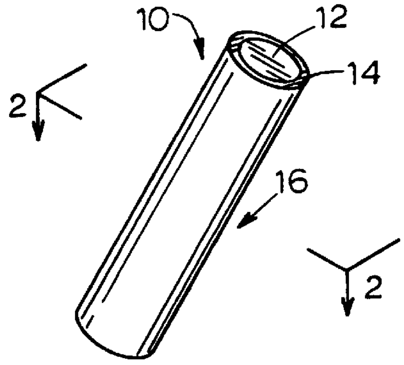
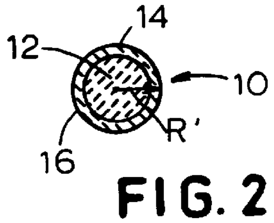
FIG. 2
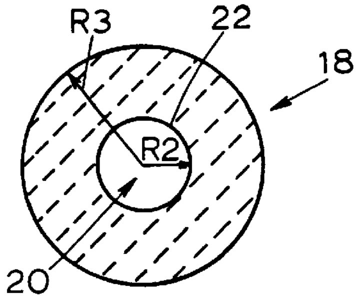
FIG. 3
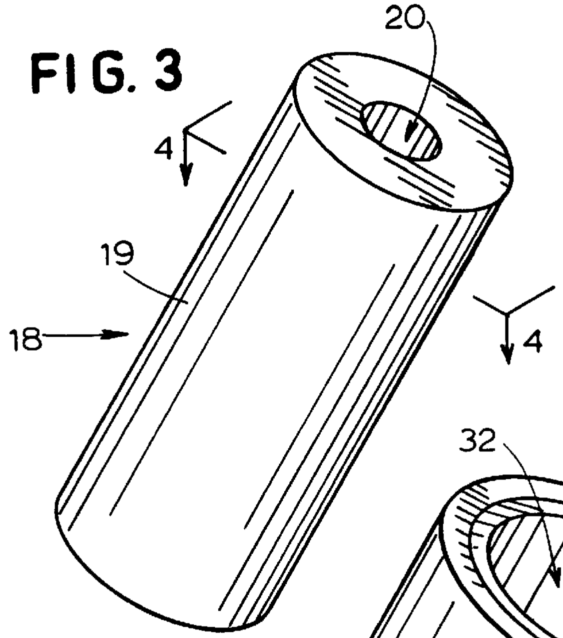
FIG. 4
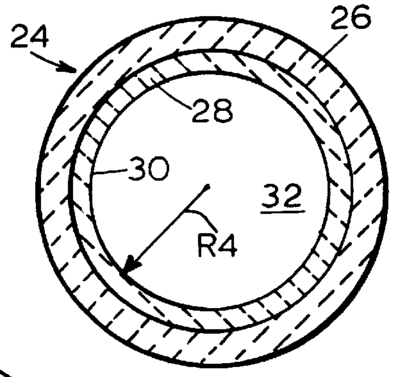
FIG. 6
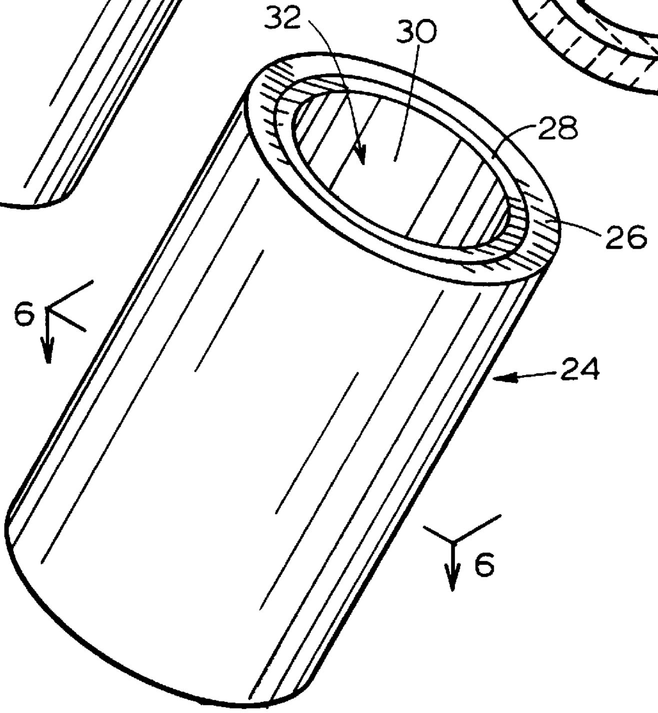
FIG. 5

METHOD OF FORMING A DIELECTRIC AND SUPERCONDUCTOR RESONANT STRUCTURE

FIELD OF INVENTION

The present invention relates generally to dielectric resonant structures and more particularly to resonant structures which use a high-temperature superconductor as a center conductor and/or outer conductor.

BACKGROUND ART

Resonant structures, used in electromagnetic filters and the like, often consist of a block or puck of dielectric material coated or plated with a conductor such as silver. One or more recesses or passageways are placed into the dielectric material, and the surfaces of the recesses or passageways are coated with a metal to form one or more center conductors. By adjusting the size, shape and configuration of the dielectric and center conductors, the properties of the resonant structure can be altered to obtain the desired electromagnetic characteristics.

Recently, high-temperature superconductors have been studied as materials for the coating on the center conductor or outer conductor of dielectric resonators. High-temperature superconductors, when cooled below their critical temperatures, have almost no electrical resistance and therefore result in extremely low losses in resonant structures containing them. Unfortunately, coating a superconductor onto a dielectric material is significantly more difficult than application of metals to those same dielectrics. Certain high-quality dielectrics such as sapphire exhibit excellent electromagnetic properties alone, but chemically react with high-temperature superconductors when coated with the superconductor. That reaction creates an undesirable microstructure in the high-temperature superconductor at the interface between the superconductor and the dielectric. Those undesirable microstructures may have poor electromagnetic properties (such as increased electrical resistance) and interfere with the overall quality of the resonant element. The effect of such electrical interference is magnified because the properties of the conductor or superconductor in the area where it contacts the dielectric are critical for optimum resonator performance. In addition, processing of the superconductor coating usually involves heating, which could damage a dielectric element if the dielectric is submitted to the processing along with the coating.

SUMMARY OF THE INVENTION

In accordance with one aspect of the present invention, a resonant structure has a first element with a high-temperature superconductor layer forming an exterior surface of that element. A second element is made of a dielectric material and has an exterior surface and an interior surface. A third element has a high-temperature superconductor layer that forms an interior surface of that third element. The exterior surface of the first element is in contact with the interior surface of the second element, and the exterior surface of the second element is in contact with the interior surface of the third element.

The exterior surface of the first element may have a circular cross-section with a first radius, and the interior surface of the second element may have a circular cross-section with a second radius. The first radius is approximately equal to the second radius. The exterior surface of the second element may have a circular cross-section with a third radius and the interior surface of the third element may have a circular cross-section with a fourth radius. The third radius may be approximately equal to the fourth radius. The interior surface of the second element may form a passageway through the second element. The interior surface of the third element may form a passageway through the third element.

The aforementioned superconductor layers may be a thick film and may be made of $YBa_2Cu_3O_7$. The dielectric material may be sapphire or one of a number of dielectrics based on barium tetratitanate. The layer of superconductor in the first element may be a coating on a substrate, and the layer of superconductor in the third element may also be a coating on a substrate.

In accordance with another aspect of the present invention, a resonant structure may have a first element with a high-temperature superconductor layer, where the layer forms an exterior surface of the first element. A second element is made of a dielectric material having an exterior surface and an interior surface. An outer element is located outside the outer surface of the second element. The exterior surface of the first element is in contact with the interior surface of the second element.

In accordance with another embodiment of the present invention, a resonant structure has a center conductor and a dielectric element made of a dielectric material having an interior surface and an exterior surface. An outer element includes a high-temperature superconductor layer forming an interior surface of the outer element. The center conductor is located in the dielectric element, and the exterior surface of the dielectric element is in contact with the interior surface of the outer element.

In accordance with another aspect of the present invention, a resonant structure including a dielectric element having an interior surface and exterior surface may be made by coating a first substrate with a layer of high-temperature superconductor to create a first element. The interior surface of a second substrate is coated with a layer of high-temperature superconductor material to create a second element. The first element is inserted into the dielectric element so that the high-temperature superconductor layer on the exterior surface of the first element is in contact with the interior surface of the dielectric element. The dielectric element is inserted into the second element so that the superconductor layer on the second element is in contact with the exterior surface of the dielectric element.

The above first element may be shrunk prior to inserting it into the dielectric element. The interior surface of the dielectric may be expanded prior to inserting the first element into the dielectric element. The dielectric may be shrunk prior to inserting the dielectric element into the second element. The second element may be expanded prior to inserting the first element and dielectric element into the second element.

Other features and advantages are inherent in the resonant structure claimed and disclosed or will become apparent to those skilled in the art from the following detailed description in conjunction with the accompanying drawing.

BRIEF DESCRIPTION OF THE DRAWING

FIG. 1 is a perspective view of a center conductor of a resonant structure of the present invention;

FIG. 2 is a cross-section taken along the lines 2—2 of FIG. 1;

FIG. 3 is a perspective view of a dielectric element of a resonant structure of the present invention;

FIG. 4 is a cross-section taken along the lines 4—4 of FIG. 3;

FIG. 5 is a perspective view of an outer element of a resonant structure of the present invention;

FIG. 6 is a cross-section taken along the line 6—6 of FIG. 5;

DETAILED DESCRIPTION

Figure 7:
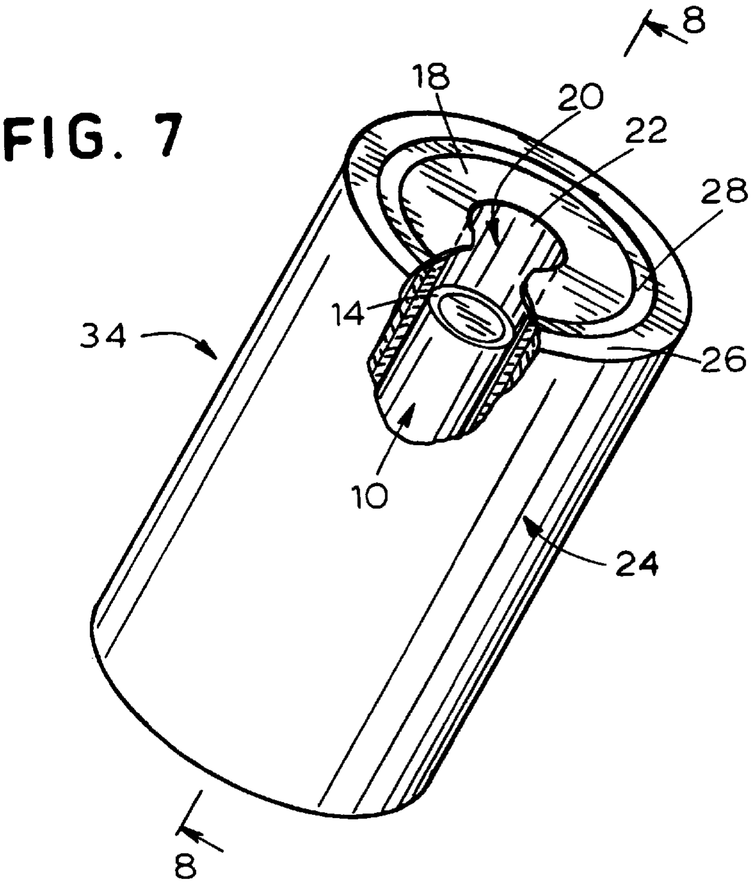
FIG. 7 is a perspective view, partially broken away, of a resonant structure of the present invention.

FIGS. 1 and 2 show a center conductor indicated generally at 10 made of a substrate 12 and a coating or layer 14 of high-temperature superconductor (also referred to as a "superconducting" material). The superconductor coating 14 forms a generally circular outer surface 16 having a cross-section $R_1$.

FIGS. 3 and 4 depict a dielectric element indicated generally at 18 having a exterior surface 19 and a passageway 20 through its interior. The passageway 20 forms a generally circular interior surface 22 having a radius $R_2$. An exterior surface 19 of the dielectric element 18 also has a circular cross-section and has a radius $R_3$. Numerous dielectrics are known in the art, for instance sapphire or compounds based on barium tetratitanate, which may be used in the dielectric element 18.

An outer element 24, depicted in FIGS. 5 and 6, has a substrate 26 with a superconductor coating or layer 28 on an interior surface of the substrate 26. The superconductor coating 28 forms an interior surface 30 and has a generally circular cross-sectioned interior surface 30 defining a radius $R_4$, as shown in FIG. 6. The superconductor layer 28 and substrate 26 form a generally cylindrical passageway 32 through the exterior element 24.

Substrates 12 and 26 can be made from any one of a variety of materials such as zirconia or silver-plated stainless steel, which are easily coated with high-temperature superconductor. A variety of superconductors and coating methods can be used to create the inner conductor 10 and the outer element 24. For instance, $YBa_2Cu_3O_7$ can be used and may be coated in a thick film onto a substrate using the method disclosed in assignee's U.S. Pat. No. 5,340,797, the disclosure of which is hereby incorporated herein by reference. Coatings 14 and 28 will not usually be as thick as they appear in FIGS. 1, 2, 5 and 6, which have been exaggerated for ease of understanding. It is also possible to use an inner conductor 10 and outer element 24 that do not have substrates onto which coatings are applied. Instead, the inner conductor 10 and outer element 24 may be formed solely of a layer of superconductor material which has been processed in such a manner that it has structural integrity.

Figure 8:
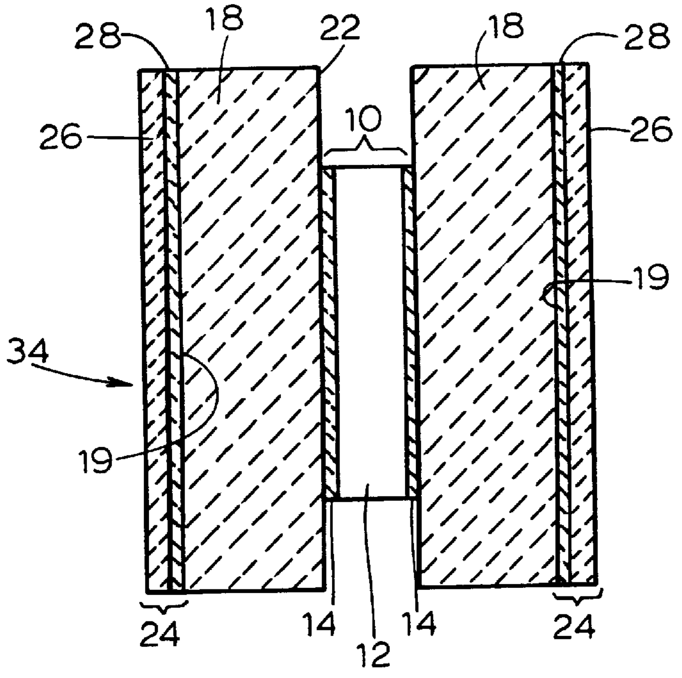
FIG. 8 is a cross-section taken along the lines 8—8 of FIG. 7.

Referring now to FIGS. 7 and 8, a resonant structure 34 is made from the inner conductor 10, the dielectric element 18 and the outer element 24. The inner conductor 10 has been inserted into the dielectric element 18 so that the outer surface 16 (FIG. 1) of the inner conductor 10, which is comprised of the superconductor coating 14, contacts the inner surface 22 of dielectric element 18. The outer surface of inner conductor 10 and the inner surface 22 of the dielectric element 18 each have circular cross-sections where the respective radii $R_1$ (FIG. 2) and $R_2$ (FIG. 4) are approximately equal. There is, therefore, excellent contact between the superconductor coating 14 and the dielectric element 18.

The resonant structure 34 is also formed by inserting the dielectric element 18 into the outer conductor 24 so that the exterior surface 19 of dielectric element 18 is in contact with the superconductor coating 28 of the outer conductor 24. The outer radius $R_3$ of the dielectric element 18 and the inner radius $R_4$ of the outer conductor 24 are approximately equal so that there is excellent contact between the superconductor 28 and the dielectric element 18. Once assembled, the resonant structure 34 has the configuration of several nested, coaxial cylinders.

Since it is desirable to have maximum contact between the layers of superconductor and adjacent dielectric, careful matching of the outer surfaces of one element with its adjacent inner surfaces is necessary. Such precise matching of surfaces may make it difficult to assemble the resonant structure 34 without damaging the elements. It may, therefore, be desirable to shrink the inner conductor 10 by cooling, for instance, so it can be more readily inserted into the passageway 20 of the dielectric element 18. It may also be desirable to heat the dielectric element 18 prior to insertion of the inner conductor 10 to expand the passageway 20 of dielectric element 18 so that it more readily receives the inner conductor 10. Once the temperatures of the two structures have converged, the arrangement will tend, if manufacturing tolerances have been accurate, to provide the desirable contact between inner and outer surfaces. Similarly, the dielectric element 18 may be cooled to shrink it, or the outer element 24 may be heated to expand it, prior to insertion of the dielectric element 18 into the space formed by the superconductor coating 28 of the outer conductor 24.

During manufacture of the inner conductor 10 and outer conductor 24, the respective superconductive coatings will be heated, cooled and subjected to various gases in order to obtain the desired superconducting microstructure, as is understood by those of skiff in the art. During such processing it is easiest to control the microstructure of the superconductor (e.g., 14 or 28) in the area farthest from the substrate (e.g., 12 or 26) onto which that superconductor has been placed. Therefore, in the inner conductor 10, the most desirable microstructure of the coating 14 after processing will be on the outer surface 16 of the superconductor coating 14 (FIG. 1). Once assembled into a resonant structure, it is that outer surface 16 which will be in contact with the inner surface 22 of the dielectric element 18. Therefore, the most desirable portion of the superconductor coating 14 will be in contact with the dielectric element 18 to enhance the electromagnetic properties of the resonant structure 34. Similarly, the inner surface 30 of the superconductor coating 28 (also in contact with the dielectric element 18 when assembled in the resonant structure 34) will have the most desirable superconductor microstructure of all areas on the outer element 24. If a superconductor coating had been applied directly to the dielectric element, either on its inner surface 22 or its outer surface 19, the microstructure of the portion of the superconductor coating immediately adjacent the dielectric element would have been difficult to control and likely have been poor. Thus the resonant structure of the present invention will have superior properties over prior methods and apparatus in which a conductor or superconductor is applied directly to a dielectric element.

Although the design of the resonant structure 34 shown in FIGS. 7 and 8 is that of concentric cylinders, many other configurations are possible. For instance, the individual elements need not have circular cross-sections, but could be of many other shapes. A circular cross-section has proven to be desirable because it avoids corners and other discontinuities which may be difficult to coat with superconductor material and/or may have undesirable electromagnetic properties at those corners. The dimensions of the elements of the resonant structure may be varied depending on the use for the structure. It is also possible to increase the number of center conductors placed into the dielectric. Those skilled in the art will be familiar with numerous such designs for non-high-temperature superconducting resonators, many of which may be implemented with high-temperature superconductor materials utilizing the present invention.

It is also not necessary for the dielectric element 18 and the outer conductor 24 to have passageways all the way through those elements. The bottoms or tops of such elements may be closed or sealed. Moreover, it may be desirable to place a coating of superconductor on the top and/or bottom of the resonant element or to coat the top and/or bottom of the center conductor 10. The present invention is useful for providing superconductor layers both inside and outside a dielectric element, but may also be used to provide such a layer on only one side of that element.

The foregoing detailed description has been given for clearness of understanding only, and no unnecessary limitations should be understood therefrom, as modifications would be obvious to those skilled int he art.

We claim:

1. A method of creating a resonant structure including a hollow dielectric element having an interior surface and an exterior surface, the method comprising:

coating an exterior surface of a first hollow element with a layer of high-temperature superconductor material;

coating an interior surface of a second hollow element with a layer of high-temperature superconductor material;

inserting the first element into the dielectric element so that the high-temperature superconductor layer on the first element is in substantial contact with the interior surface of the dielectric element; and inserting the dielectric element into the second element so that the superconductor layer on the second element is in substantial contact with the exterior surface of the dielectric element.

2. The method of claim 1 comprising shrinking the first element prior to inserting it into the dielectric element.

3. The method of claim 1 comprising expanding the interior surface of the dielectric element prior to inserting the first element into the dielectric element.

4. The method of claim 1 comprising shrinking the dielectric element prior to inserting a dielectric element into the second element.

5. The method of claim 1 comprising expanding the second element prior to inserting the dielectric element into the second element.

6. A method of creating a resonant structure, the method comprising:

creating a first hollow element comprising a layer of high-temperature superconductor material formed on its exterior surface;

shrinking the first element; and inserting the first element into a hollow dielectric element so that the high-temperature superconductor material on the first element is in substantial contact with an interior surface of the dielectric element.

7. The method of claim 6 wherein shrinking the first element is carried out by cooling.

8. The method of claim 6 further comprising:

creating a second hollow element comprising a layer of high-temperature superconductor material formed on its interior;

inserting the dielectric element into the second element so that the high-temperature superconductor material on the second element is in substantial contact with the exterior surface of the dielectric element.

* * * * *